(12) United States Patent
O'Connor

(10) Patent No.: US 6,310,927 B1
(45) Date of Patent: Oct. 30, 2001

(54) FIRST ORDER TUNING CIRCUIT FOR A PHASE-LOCKED LOOP

(75) Inventor: James T. O'Connor, Dallas, TX (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 08/221,030

(22) Filed: Mar. 31, 1994

(51) Int. Cl.$^7$ ................................................. H03D 3/24
(52) U.S. Cl. .................... 375/376; 329/307; 455/260; 455/262
(58) Field of Search ................................. 375/120, 374, 375/375; 331/1 A, 17, 25; 329/307; 455/260, 262

(56) References Cited

U.S. PATENT DOCUMENTS

| | | | |
|---|---|---|---|
| 4,464,771 | * | 8/1984 | Sorensen ............................. 375/374 |
| 4,736,167 | * | 4/1988 | Kojima et al. ......................... 331/17 |
| 4,829,391 | * | 5/1989 | Vargas, Jr. ............................ 331/25 |
| 4,862,105 | * | 8/1989 | Walbrou et al. ...................... 331/17 |
| 4,901,033 | * | 2/1990 | Herold et al. ......................... 331/17 |
| 5,052,022 | * | 9/1991 | Nishita et al. ........................ 375/376 |
| 5,052,032 | * | 9/1991 | Uchikoshi ............................. 375/120 |
| 5,126,692 | * | 6/1992 | Shearer et al. ........................ 331/17 |
| 5,175,884 | * | 12/1992 | Suarez ................................ 455/260 |
| 5,276,712 | * | 1/1994 | Pearson .............................. 375/376 |

\* cited by examiner

*Primary Examiner*—Temesghen Ghebretinsae
(74) *Attorney, Agent, or Firm*—Lisa K. Jorgenson; Daniel E. Venglarik

(57) ABSTRACT

A first order phase-locked loop includes a tuning circuit which allows phase lock to be quickly reached, and to be maintained during transient situations such as loss of the data signal. Such an improved circuit has a tuning circuit for the voltage controlled oscillator which utilizes two capacitors. Two signals are used to drive a first, larger, capacitor, and have the same duty cycle when the capacitor voltage is proper and the voltage controlled oscillator is operating at the correct frequency. A second, smaller, capacitor is used to quickly achieve phase lock with the incoming data signal. The use of two oppositional signals to drive the capacitors allows them to more quickly be charged or discharged to the proper voltage level to obtain both frequency and phase lock with the incoming data signal. Thus, the circuit is able to quickly acquire lock during power-up, or reacquire lock under circumstances where the operating condition of the circuit changes suddenly. The circuit always locks to the correct frequency, as opposed to a harmonic thereof.

12 Claims, 6 Drawing Sheets

FIRST ORDER TUNING CIRCUIT FOR A PHASE-LOCKED LOOP

BACKGROUND OF THE INVENTION

1. Field of the Invention

The present invention relates generally to electronic circuits, and more specifically to a phase-locked loop circuit having a novel tuning circuit.

2. Description of the Prior Art

Phase-locked loop circuits are well known in the industry generally, and are known as circuits highly suitable to integration in monolithic integrated circuits. Typical applications of phase-locked loops include tone decoding, demodulation of AM and FM signals, frequency multiplication, frequency synthesis, and pulse synchronization of signals from noisy sources. For example, in local area networks based on network technology such as ethernet, phase lock loop circuitry can be used to both lock onto the data signal made available over the communication line, and to allow the underlying clock signal to be extracted from the data.

First order phase-locked loop circuits have a phase detector, an amplifier, and a voltage controlled oscillator. The output of the voltage controlled oscillator is fed back into the phase detector, which generates a signal indicative of the phase differential between the signal input and the output of the voltage controlled oscillator. A second order phase-locked loop additionally contains a low-pass filter between the output of the phase detector and the input of the amplifier.

It is well known that first order and second order phase-locked loops have different advantages and drawbacks. One drawback of known first order loops is that they do not have the desirable "flywheel" property, allowing the voltage controlled oscillator to smooth out noise in the input signal and maintain lock even if the input signal is lost for a short period of time. First order phase-lock loops are known to have the advantages of increased capture range and decreased capture time, allowing lock to be obtained much faster than typical second order circuits.

It would be desirable to provide an improved first order phase-locked loop design which allows the advantages of first order circuits to be retained, while overcoming some of the disadvantages. It would be desirable for such a circuit to ensure lock to the correct frequency. It would be desirable for the technology used in such improved circuit to be of a type which can be easily incorporated into standard integrated circuit devices.

SUMMARY OF THE INVENTION

Therefore, in accordance with the present invention, a first order phase-locked loop includes a tuning circuit which allows phase lock to be quickly reached, and to be maintained during transient situations such as loss of the data signal. Such an improved circuit has a tuning circuit for the voltage controlled oscillator which utilizes two capacitors. Two signals are used to drive a first, larger, capacitor, and have the same duty cycle when the capacitor voltage is proper and the voltage controlled oscillator is operating at the correct frequency. A second, smaller, capacitor is used to quickly achieve phase lock with the incoming data signal. The use of two oppositional signals to drive the capacitors allows them to more quickly be charged or discharged to the proper voltage level to obtain both frequency and phase lock with the incoming data signal. Thus, the circuit is able to quickly acquire lock during power-up, or reacquire lock under circumstances where the operating condition of the circuit changes suddenly. The circuit always locks to the correct frequency, as opposed to a harmonic thereof.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
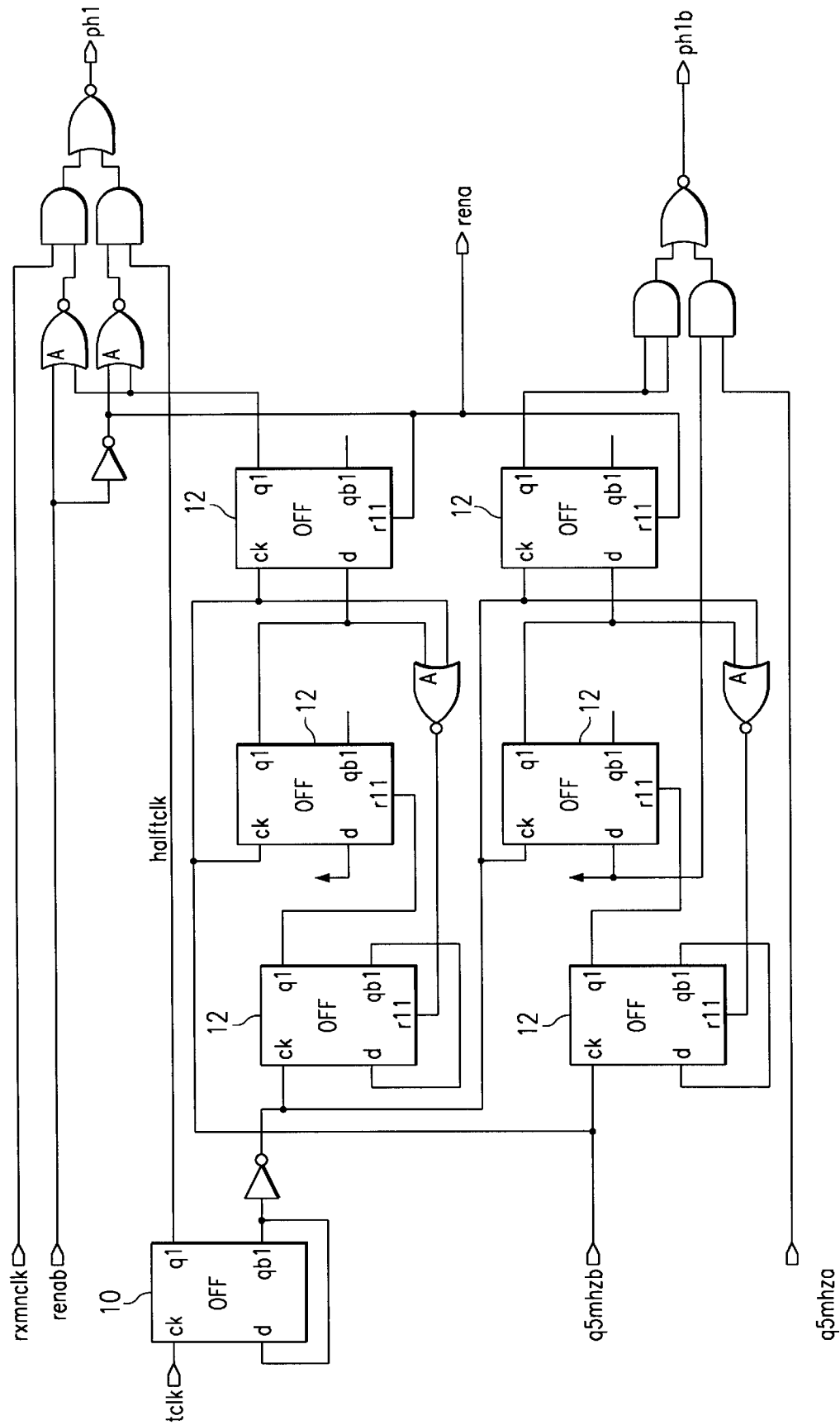
FIGS. 1–3 are a schematic diagram of the preferred embodiment of a phase-locked loop circuit in accordance with the present invention.
Figure 2A:
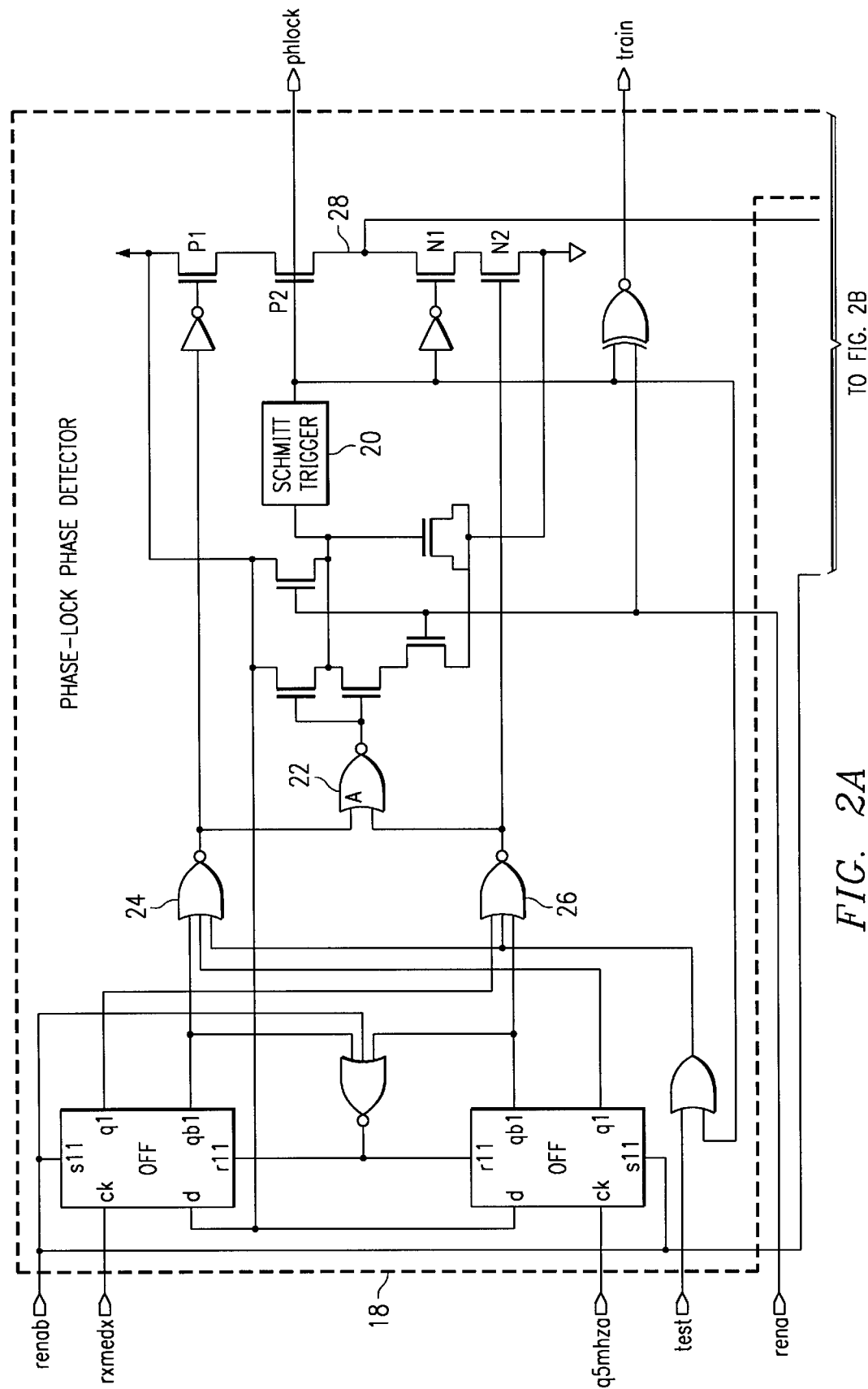
Figure 2B:
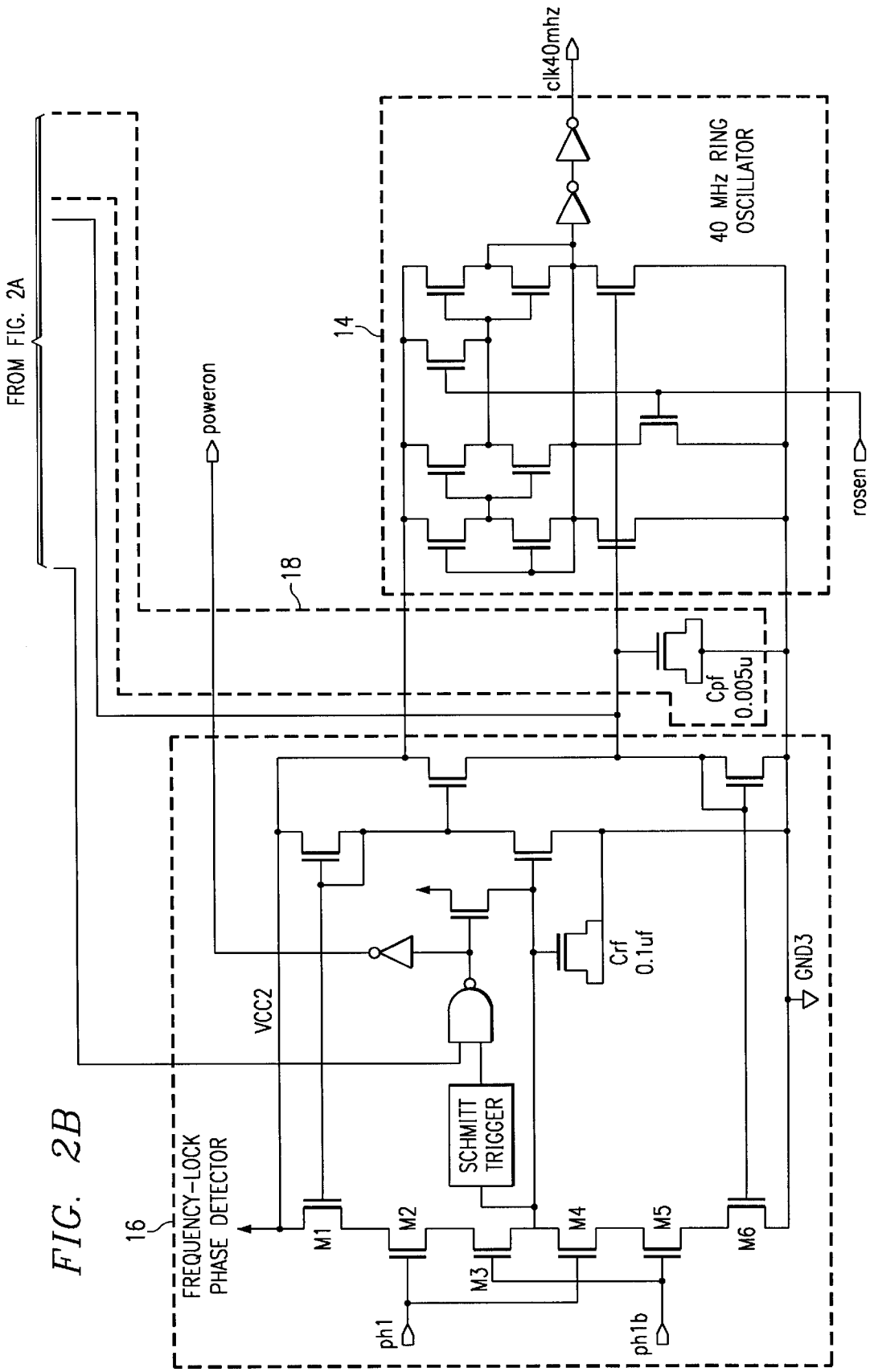
Figure 3A:
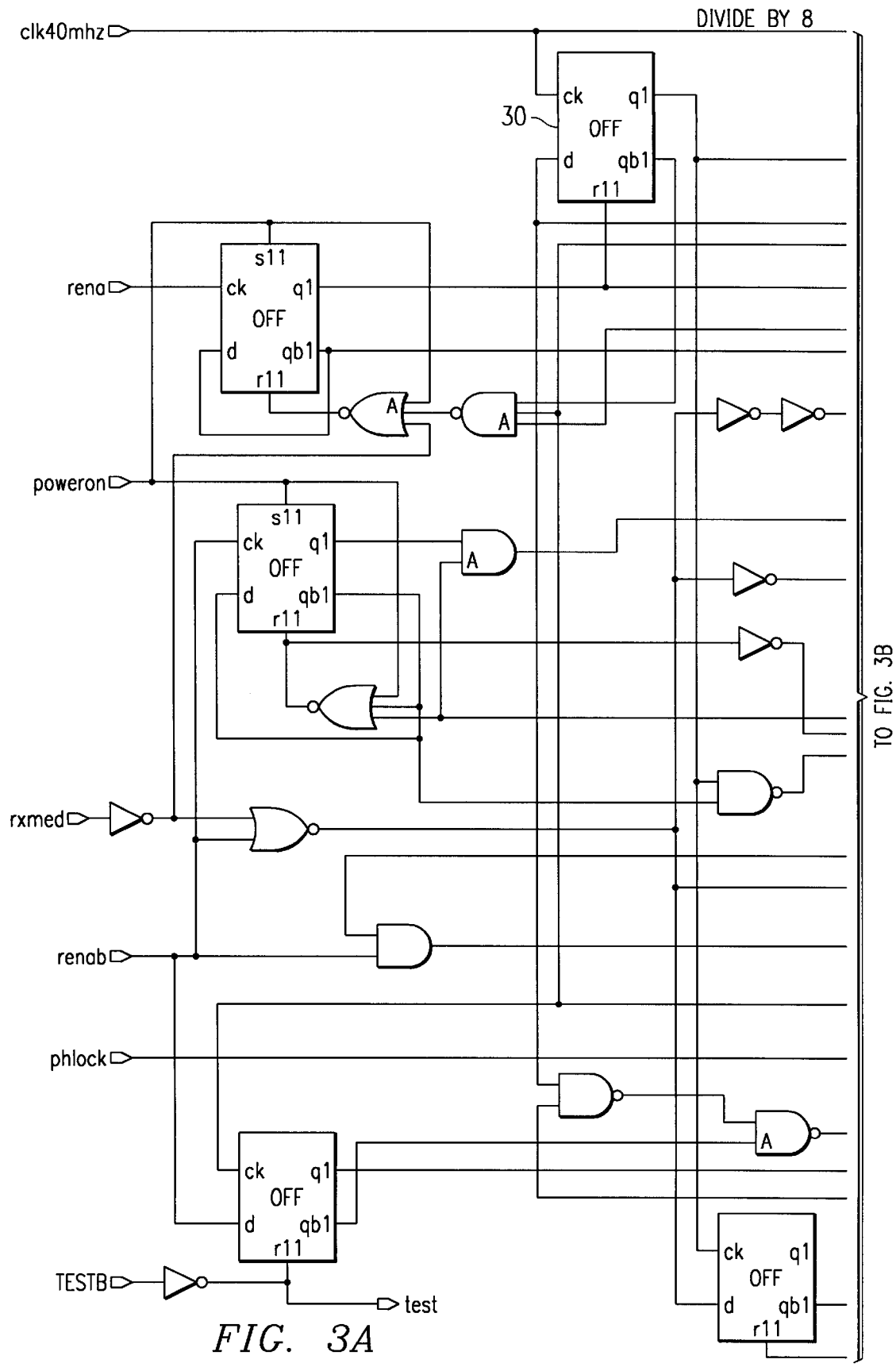
Figure 3B:
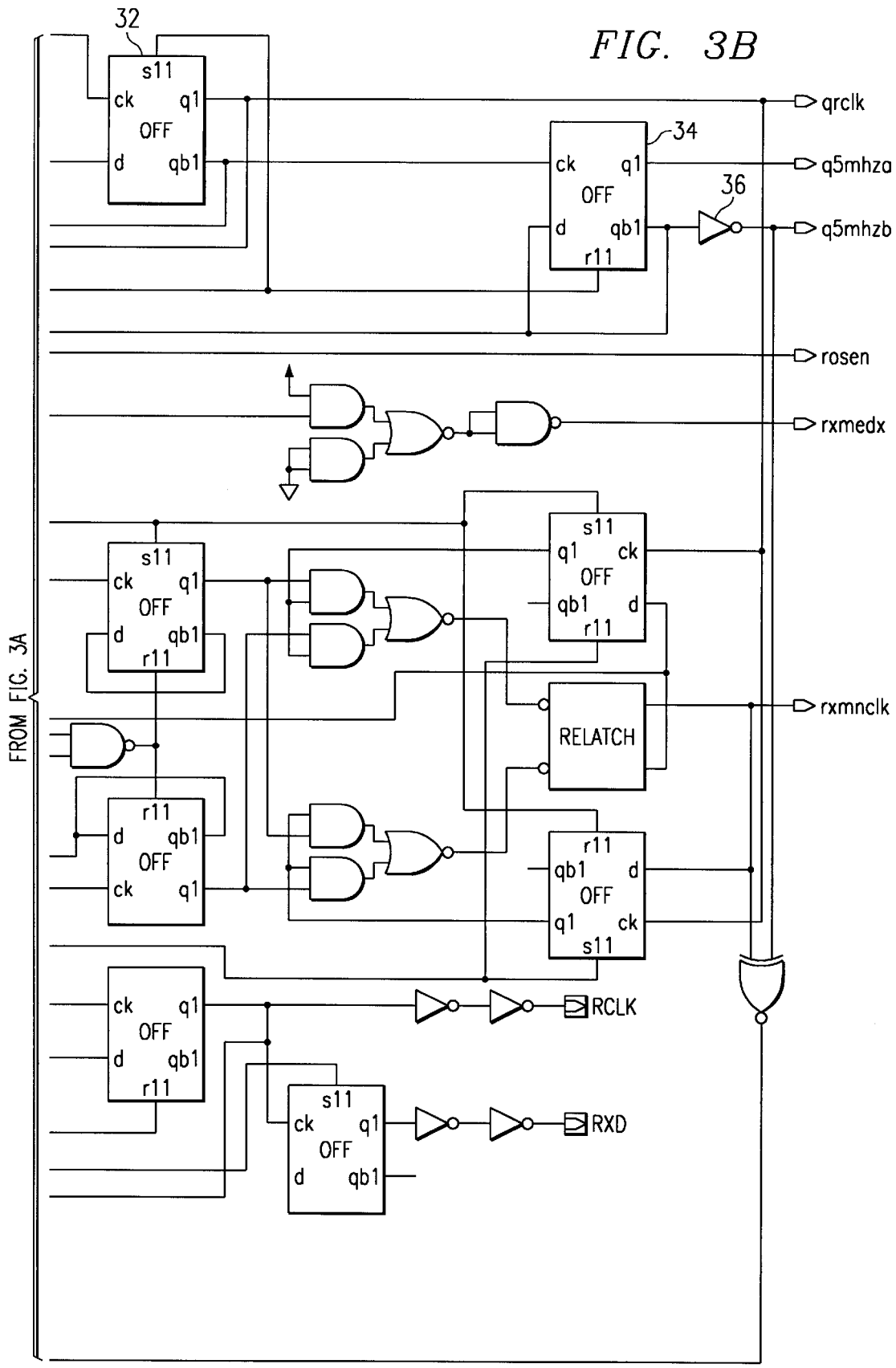

The preferred embodiment of a phase-locked loop circuit according to the present invention is described in FIGS. 1–3. The preferred embodiment is preferably implemented as part of a monolithic semiconductor integrated circuit using CMOS technology. Preferably, the described circuitry is incorporated into a larger device useful for decoding and synchronizing ethernet signals as known in the art. The data clock signal must be extracted from the data stream itself, as it is not supplied separately.

It will be appreciated by those skilled in the art that the invention described below may be implemented in numerous ways, using differing technologies and logic circuits which differ from those presented in detail in the drawings. Because detailed data and device interconnections are shown in the drawings, not all of the operational details of the circuitry of FIGS. 1–3 will be described. The following description is primarily limited to those parts of the circuitry of the preferred embodiment which relate to the present invention.

Referring to FIG. 1, the signal rxmnclk represents a Manchester clock derived from a data signal as will be described in more detail in FIG. 3. The signal renab is a control signal which is used to enable the read capability of the circuit. When renab is low, the circuit is enabled and the clock signal rxmnclk is used to generate the output signal phi. When renab is high, the signal halftclk is used to generate the signal phi. halftclk is derived from the signal tclk, which is a 10 Mhz reference clock signal preferably generated, with a tuned crystal or by other means, elsewhere on a chip containing the circuitry of the present invention. The signal tclk is preferably an accurate signal, but precise accuracy is not critical because the circuit will lock to the signal rxmnclk when data is available. The signal halftclk is a 5 Mhz signal which is obtained by dividing tclk by two in the D flip-flop 10.

The signals q5mhzb and q5mhza are signals having identical values, and are generated by the circuitry shown in FIG. 3. These signals are used to generate the signal phib. The signals phi and phib have the same frequency when the frequency of the selected rxmnclk or tclk is exactly the same as q5mhza. If these frequencies differ by some amount, phi and phib will have differing frequencies and phases which will allow the frequency of a voltage controlled oscillator to be varied as described in connection with FIGS. 2 and 4.

The signal rena is simply the complement of renab. The D flip-flops 12 compare the frequency of positive edges of the signals halftclk and q5mhzba. If the transitions occur alternatively, the frequencies are the same and phi and phib are driven with the same frequency and duty cycle. If one signal has a higher frequency than the other, it will eventually have two positive transitions between a pair of transitions of the lower frequency signal. The duty cycle of one of the signals phi or phib will be changed in response to this occurrence, which will change the frequency of q5mhza and q5mhzb as is described in connection with FIG. 2. If the frequency of g5mhzb is too low, the duty of phib will be changed to provide more low time. If the frequency of q5mhzb is too high, the duty cycle of phi will be changed to provide more high time.

Referring to FIG. 2, a 40 Mhz oscillator 14 is illustrated along with frequency-lock and phase lock circuits 16 and 18. The 40 Mhz ring oscillator is used to generate clk40mhz. The ring oscillator is a voltage controlled oscillator with the output frequency determined by the voltage across Crf and Cpf. As the voltage across Crf increases, the frequency generated by the oscillator 14 increases. The frequency decreases as the voltage across Crf decreases.

Transistors M1–M6 function as a complementary phase detector. Driven by phi and phib, these transistors control the charging and discharging of capacitor Crf, which in turn controls the frequency of the oscillator 14. If phi and phib are completely out of phase (complementary), the charge on Crf remains unchanged. This is the normal locked condition. If phi and phib are somewhat in phase, Crf is alternately charged and discharged. Because it is a very large capacitor, preferably an external component having a value of 0.1 vf, Crf has a long time constant and charges and discharges relatively slowly.

Because the duty cycles of phi and phib are changed, as described in connection with FIG. 1, when their frequencies differ, Crf will receive a net charge or discharge when q5mhzb is respectively slower or faster than halftclk, or rxmnclk when actual data is being read. When the oscillator frequency is too high, the increased low time of phib causes Crf to charge up. Crf is discharged when the oscillator frequency is too high, increasing the high time of phi.

The phase lock phase detector 18 is a typical implementation of a phase detector circuit as known in the art, with the addition of four field effect devices: P1, P2, N1, and N2. These devices are used to provide charging for the phase capacitor Cpf in order to match the phase of the oscillator with the incoming signal. When the read enable control signal rena is low, indicating that read is not enabled, the input to the Schmidt trigger 20 will be high and transistors P2 and N1 will be off. This will isolate the charge storage node of capacitor Cpf. If rena is high, the input of the Schmidt trigger will be driven alternately high and low by the output of the NOR gate 22. If the output of the NOR gate 22 is high, the input to the Schmidt trigger 20 will be pulled low and transistors N1 and P2 will be on. They will both be off whenever the output of the NOR gate 22 is low. This will occur when either of the outputs of the other two NOR gates 24, 26 is low.

The common node 28 will be charged to Vcc or discharged through ground whenever the output of the first NOR gate 22 is high, and the other two NOR gates 24, 26 have different values. Because this can only happen for a short transitional time, when the signals rxmedx and q5mhza are out of phase, the charge on capacitor Cpf will be changed only when the two clock signals are out of phase. When they are in phase, no change will be made to the voltage of the common node 28, keeping the 40 Mhz oscillator in phase.

Referring to FIG. 3, additional circuitry utilized in the preferred embodiment is shown. The three flip-flops 30, 32, 34 form a divide by eight counter which divides the 40 Mhz signal clk40mhz down to the 5 Mhz signal q5mhza. The inverting buffer 36 causes q5mhzb to have the same value as q5mhza, but it is buffered to drive a larger load.

Near the bottom of FIG. 3, the signal RCLK is a 10 Mhz ethernet clock signal in phase with the incoming data. This signal toggles at the same time as the signal qrclk, and is enabled by the phase-locked signal phlock.

The received data is made available as signal RXD which is derived from the received data signal rxmed. In response to the enabling signal renab, the central portion of the circuitry shown in FIG. 3 generates a received data signal rxmedx, which is a buffered signal having the same polarity as rxmed, and a received Manchester clock rxmnclk. This is the derived clock signal extracted from the data stream, and is the signal which is locked onto by the phase-locked loop.

Figure 4:
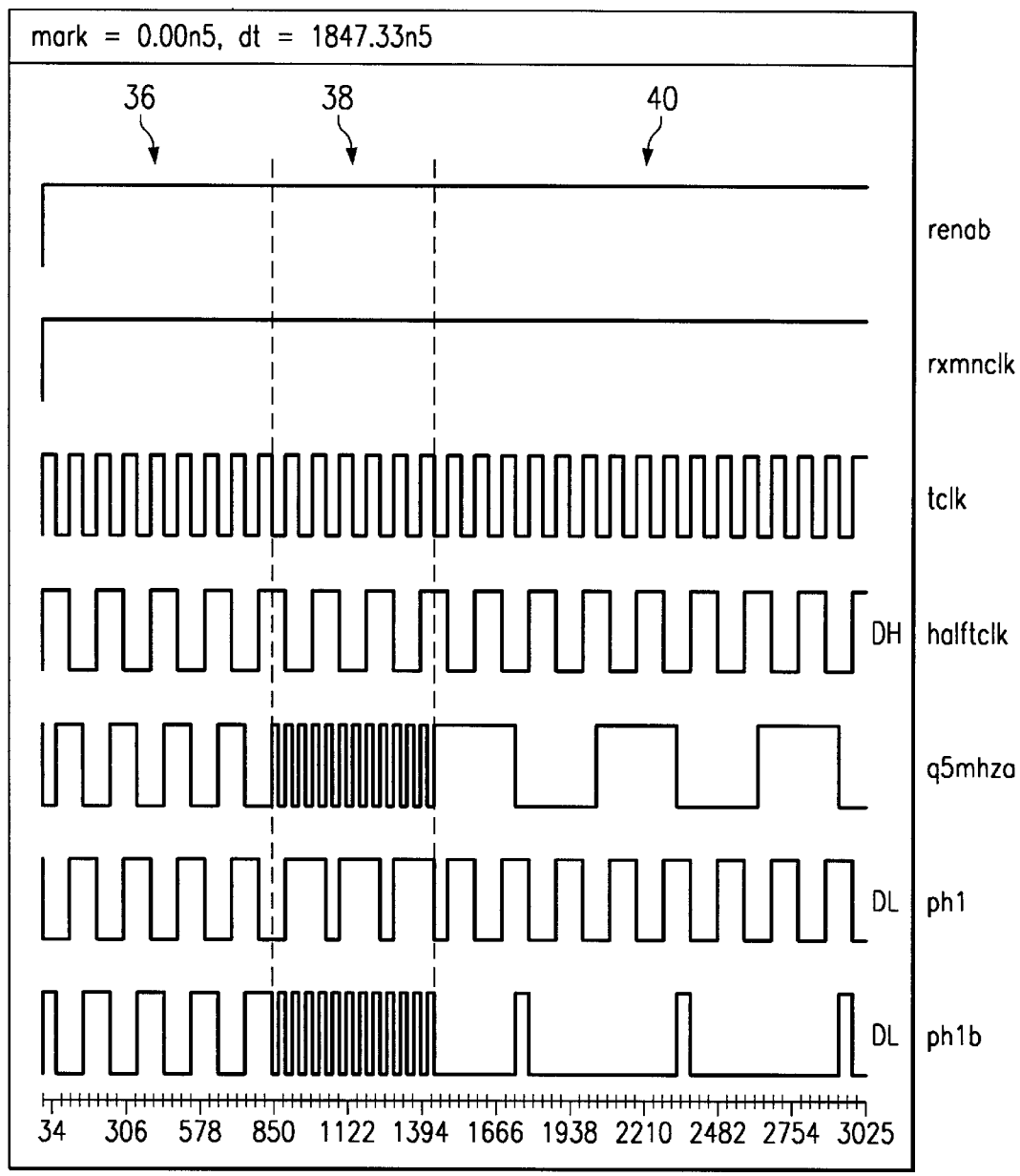
FIG. 4 is a timing diagram showing voltage waveforms at various parts of the circuit of FIGS. 1–3.

Referring to FIG. 4, a series of waveforms illustrates the different operating conditions for the phase-locked loop. In this example, the signal renab is high, indicating that read enable is inhibited. Thus, the derived Manchester clock signal rxmnclk remains high, and the phase-locked loop is locked to the internal signal tclk. As described earlier, locking to this internal signal enables the circuit to remain approximately frequency locked even during an extended loss of data. Once the enabling control signal changes state, the phase-locked loop can quickly lock to the frequency of the clock signal rxmnclk derived from the incoming data. The operation of the remaining portions of the circuit are identical regardless of which signal is used to lock to.

FIG. 4 shows the signals tclk, halftclk, q5mhza, phi, and phib. The signal tclk remains constant throughout, being generated by the on chip crystal oscillator. The frequency of halftclk also remains constant because it is derived from tclk as shown in FIG. 1.

FIG. 4 is divided into three portions 36, 38, 40, separated by dashed lines, which have no relation to each other. Each portion illustrates a different scenario for the relationship between the signals halftclk and q5mhza.

In the first scenario, halftclk and q5mhza have a constant frequency and phase relationship. Thus, exactly one rising edge of halftclk occurs between each pair of rising edges of q5mhza. In this case, phi is the inverse of halftclk, and phib is the inverse of q5mhza. This is a stable state for the system, indicating that a lock condition has occurred.

In the second scenario, q5mhza is much faster than halftclk. This causes the high time of phi to be greater than its low time, which causes Crf to discharge more than it charges. A lower voltage on Crf will cause the 40 Mhz oscillator 14 to slow down, guaranteeing that q5mhza will converge to the frequency of halftclk.

In the third scenario, the output of q5mhza is less than that of halftclk. In this case, the low time of phib is greater than its high time, which causes Crf to charge more than it discharges. This will raise the voltage across Crf increasing the frequency of the 40 Mhz oscillator 14 and eventually forcing the convergence of q5mhza with halftclk.

The described technique for charging the capacitor Crf has particular significance during the power-up condition, when the initial voltage of Crf is being established. It is also very useful under any circumstance where the operating condition of the circuit changes suddenly, enabling phase lock to be quickly established and maintained. Because Crf is a relatively large capacitor, its voltage won't change drastically once frequency lock is obtained even if the input signal is lost for a short time. The smaller capacitor Cpf allows phase lock to be quickly obtained once frequency lock is made, typically generating a lock within approximately five clock periods.

Thus, the improved technique for charging and discharging the frequency reference capacitor Crf guarantees convergence to the true frequency of the data, as opposed to convergence to a harmonic. Such convergence occurs quickly and is maintained reliably even during transient conditions.

While the invention has been particularly shown and described with reference to a preferred embodiment, it will be understood by those skilled in the art that various changes in form and detail may be made therein without departing from the spirit and scope of the invention.

What is claimed is:

1. A phase-locked loop circuit, comprising:
   a clock input for receiving a data clock signal having an input frequency;
   a voltage controlled oscillator for generating a VCO output clock signal having an output frequency controlled by a voltage across a capacitor;
   a tuning circuit for generating first and second control signals in response to the input frequency of the data clock signal and the output frequency of the VCO output clock signal; and
   means for applying both the first and second control signals to the capacitor to apply and remove charge to the capacitor proportional to the phase similarity between the first and second control signals.

2. The circuit of claim 1, wherein the tuning circuit generates the first and second control signals having a predetermined duty cycle when the data clock and VCO clock signals are locked, and wherein the duty cycle of one of the control signals is increased over the predetermined duty cycle when the data clock and VCO clock signals are not locked.

3. The circuit of claim 2, wherein the frequency of the VCO clock signal is greater than the data clock signal, and wherein the VCO clock signal is divided down to a lower frequency before it is used by the tuning circuit.

4. The circuit of claim 3, wherein the data clock signal is also divided down to a lower frequency before it is used by the tuning circuit.

5. The circuit of claim 4, wherein the tuning circuit generates the first-and second control signals with the predetermined duty cycle when the divided down VCO clock signal and the divided down data clock signal have the same frequency.

6. The circuit of claim 4, wherein the data clock signal has a frequency of 10 Mhz, and is divided down to a frequency of 5 MHz, and wherein the VCO clock signal has a frequency of 40 MHz and is divided down to a frequency of 5 MHz.

7. The circuit of claim 2, wherein the duty cycle of the first control signal is increased relative to that of the predetermined duty cycle when the VCO clock has a frequency higher than that required to provide lock with the data clock signal, and wherein the duty cycle of the second control signal is decreased relative to that of the predetermined duty cycle when the VCO clock has a frequency lower than that required to provide lock with the data clock signal.

8. The circuit of claim 7, wherein the frequency of the voltage controlled oscillator is higher when a higher voltage is present across the capacitor, and lower when a lower voltage is present across the capacitor.

9. The circuit of claim 8, wherein the applying means charges the capacitor to a higher voltage when the duty cycle of the first control signal is greater than the predetermined duty cycle, and discharges the capacitor to a lower voltage when the duty cycle of the second control signal is less than the predetermined duty cycle.

10. The circuit of claim 1, further comprising a phase locking circuit for controlling the phase of the voltage controlled oscillator to adjust the phase of the VCO clock signal relative to the data clock signal.

11. A method of controlling a phase locked loop circuit, comprising the steps of:
    receiving a data clock signal having an input frequency;
    generating a VCO output clock signal in a voltage controlled oscillator having an output frequency;
    controlling the output frequency of the VCO output clock signal by varying the voltage across a capacitor;
    generating first and second control signals as a function of the relative frequencies of the data clock and VCO clock signals; and
    adjusting the voltage across the capacitor as a function of the phase overlap between the duty cycles of both the first and second control signals.

12. The method of claim 11, wherein the duty cycle of the first control signal is changed when the VCO clock frequency is less than that required to lock to the data clock signal, and wherein the duty cycle of the second control signal is changed when the VCO clock frequency is greater than that required to lock to the data clock signal.

* * * * *